(12) United States Patent
Ko et al.

(10) Patent No.: US 9,006,374 B2
(45) Date of Patent: Apr. 14, 2015

(54) CURABLE COMPOSITION

(71) Applicant: LG Chem, Ltd., Seoul (KR)

(72) Inventors: Min Jin Ko, Daejeon (KR); Bum Gyu Choi, Daejeon (KR); Myung Sun Moon, Daejeon (KR); Jae Ho Jung, Daejeon (KR); Dae Ho Kang, Daejeon (KR); Min Kyoun Kim, Daejeon (KR); Byung Kyu Cho, Seoul (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 14/094,209

(22) Filed: Dec. 2, 2013

(65) Prior Publication Data

US 2014/0088281 A1  Mar. 27, 2014

Related U.S. Application Data

(63) Continuation of application No. PCT/KR2012/010070, filed on Nov. 26, 2012.

(30) Foreign Application Priority Data

Nov. 25, 2011  (KR) .................. 10-2011-0124657
Nov. 26, 2012  (KR) .................. 10-2012-0134550

(51) Int. Cl.
*C08G 77/04* (2006.01)
*C09K 11/00* (2006.01)
*H01L 33/00* (2010.01)
*H01L 23/29* (2006.01)
*H01L 33/56* (2010.01)
*C08K 5/5415* (2006.01)
*C08L 83/04* (2006.01)

(52) U.S. Cl.
CPC .............. *H01L 23/296* (2013.01); *H01L 33/56* (2013.01); *C08G 77/04* (2013.01); *C08K 5/5415* (2013.01); *C08L 83/04* (2013.01)

(58) Field of Classification Search
None
See application file for complete search history.

(56) References Cited

U.S. PATENT DOCUMENTS

| 5,530,075 | A * | 6/1996 | Morita et al. ............... 525/431 |
| 8,080,614 | B2 * | 12/2011 | Morita et al. ............... 525/100 |
| 8,258,502 | B2 * | 9/2012 | Yoshitake et al. ............... 257/40 |
| 8,299,186 | B2 * | 10/2012 | Sagawa et al. ............... 525/478 |
| 2002/0161140 | A1 * | 10/2002 | Yoneda et al. ............... 526/90 |
| 2004/0241927 | A1 * | 12/2004 | Kato et al. ............... 438/202 |
| 2005/0212008 | A1 * | 9/2005 | Miyoshi ............... 257/100 |
| 2006/0073347 | A1 * | 4/2006 | Morita et al. ............... 428/447 |
| 2006/0081864 | A1 * | 4/2006 | Nakazawa ............... 257/98 |
| 2007/0112147 | A1 * | 5/2007 | Morita et al. ............... 525/478 |
| 2009/0099321 | A1 * | 4/2009 | Yoshitake et al. ............... 525/475 |
| 2009/0118440 | A1 * | 5/2009 | Nakanishi et al. ............... 525/478 |
| 2009/0123764 | A1 * | 5/2009 | Morita et al. ............... 428/446 |
| 2011/0147955 | A1 * | 6/2011 | Kashiwagi ............... 257/791 |
| 2013/0009201 | A1 * | 1/2013 | Ko et al. ............... 257/100 |
| 2013/0187176 | A1 * | 7/2013 | Ko et al. ............... 257/88 |

FOREIGN PATENT DOCUMENTS

| CN | 101213257 A | 7/2008 | |
| JP | 2009-173789 | 8/2009 | |
| KR | 10-2007-0004594 | 1/2007 | |
| KR | 10-2011-0087243 | 8/2011 | |
| KR | 1020110087244 A | 8/2011 | |
| KR | 10-1080156 | 11/2011 | |
| WO | WO 2011090364 A2 * | 7/2011 | ............... C08L 83/04 |

* cited by examiner

*Primary Examiner* — Robert S Loewe
(74) *Attorney, Agent, or Firm* — McKenna Long & Aldridge, LLP

(57) ABSTRACT

This application relates to a curable composition and its use. The curable composition may exhibit excellent processibility and workability. The curable composition has excellent light extraction efficiency, crack resistance, hardness, thermal and shock resistance and an adhesive property after curing. The curable composition may provide a cured product exhibiting stable durability and reliability under severe conditions for a long time and having no whitening and surface stickiness.

15 Claims, No Drawings

CURABLE COMPOSITION

This application is a Continuation Bypass of International Application No. PCT/KR2012/010070, filed Nov. 26, 2012, which claims priority to and the benefit of Korean Patent Application Nos. 10-2011-0124657, filed on Nov. 25, 2011, and 10-2012-0134550, filed on Nov. 26, 2012, the disclosures of which are incorporated herein by reference in their entirety.

FIELD

The present application relates to a curable composition and its use.

BACKGROUND

A light-emitting diode (LED), particularly a blue or ultraviolet (UV) LED having an emission wavelength of approximately 250 to 550 nm, is a high-brightness product using a GaN-based compound semiconductor such as GaN, GaAlN, InGaN or InAlGaN. In addition, it is possible to form a high-quality full-color image by a method of combining red and green LEDs with a blue LED. For example, a technique of manufacturing a white LED by combining a blue or UV LED with a fluorescent material has been known. Such LEDs are being widely used as backlights for liquid crystal displays (LCDs) or general lightings.

As an LED encapsulant, an epoxy resin having a high adhesive property and excellent mechanical durability is being widely used. However, the epoxy resin has lower light transmittance of a blue light or UV ray region, and low light resistance. Accordingly, for example, the patent documents 1 to 3 disclose techniques for solving the above-described problems. However, encapsulants disclosed in the above references do not have sufficient thermal and light resistance.

As a material having excellent light and thermal resistance with respect to a low wavelength region, a silicon resin has been known. However, the silicon resin has stickiness on a cured surface. In addition, to effectively apply the silicon resin as an encapsulant for an LED, characteristics such as high refractivity, crack resistance, surface hardness, adhesive strength and thermal and shock resistance need to be ensured.

PRIOR ART DOCUMENTS

<Patent document 1> Japanese Patent Publication No. H11-274571
<Patent document 2> Japanese Patent Publication No. 2001-196151
<Patent document 3> Japanese Patent Publication No. 2002-226551

CONTENT OF THE INVENTION

Technical Object

The present application provides a curable composition and its use.

Technical Solution

Iorganopolysiloxane having an aliphatic unsaturated bond (referred to as "organopolysiloxane (A)") and (B) an organopolysiloxane having at least each one of an alkenyl group, an aryl group and an epoxy group (referred to as "organopolysiloxane (B)").

The organopolysiloxane (A) may be an organopolysiloxane having a partially-crosslinked structure. The term "partially-crosslinked structure" may refer to a structure of an organopolysiloxane in which a linear structure derived from a bifunctional siloxane unit possibly represented as $(R_2SiO_{2/2})$ (hereinafter referred to as a "D unit") is sufficiently long, and a trifunctional siloxane unit possibly represented as $(RSiO_{3/2})$ (hereinafter referred to as a "T unit") is partially introduced. In one example, the partially-crosslinked structure may refer to a structure having a ratio (D/(D+T)) of D units with respect to all D and T units included in an organopolysiloxane of 0.7 or more. The ratio (D/(D+T)) may be, for example, less than 1.

In one example, the organopolysiloxane (A) may be represented as an average composition formula of Formula 1.

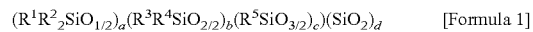

$(R^1R^2{}_2SiO_{1/2})_a(R^3R^4SiO_{2/2})_b(R^5SiO_{3/2})_c(SiO_2)_d$     [Formula 1]

In Formula 1, $R^1$ is a monovalent hydrocarbon group having at least two carbon atoms, $R^2$ is an alkyl group having 1 to 4 carbon atoms, $R^3$ and $R^4$ are each independently an alkyl group having 1 to 20 carbon atoms, an alkenyl group having 2 to 20 carbon atoms or an aryl group having 6 to 25 carbon atoms, $R^5$ is an alkyl group having 1 to 20 carbon atoms or an aryl group having 6 to 25 carbon atoms, at least one of $R^1$, $R^3$ and $R^4$ is an alkenyl group, a is a positive number, b is 0 or a positive number, c is a positive number, d is 0 or a positive number, b/a is 5 or more, and b/c is 5 or more.

The expression "organopolysiloxane is represented as a certain average composition formula" used herein means that the organopolysiloxane is a single component represented as the certain average composition formula, or a mixture or reaction product of at least two components, and the average of compositions of respective components in the mixture or reaction product is represented as the certain average composition formula.

The term "monovalent hydrocarbon group" used herein may refer to a monovalent residue derived from an organic compound composed of carbon and hydrogen, or a derivative thereof. The monovalent hydrocarbon group includes one or at least two carbon atoms, and may be, for example, a monovalent hydrocarbon group having 1 to 25 or 2 to 25 carbon atoms. The monovalent hydrocarbon group may be, for example, an alkyl group, an alkenyl group or an aryl group.

The term "alkyl group" used herein may refer to, unless specifically defined otherwise, an alkyl group having 1 to 20, 1 to 16, 1 to 12, 1 to 8, or 1 to 4 carbon atoms. The alkyl group may have a linear, branched or cyclic structure, and may be optionally substituted with at least one substituent.

The term "alkenyl group" used herein may refer to, unless specifically defined otherwise, an alkenyl group having 2 to 20, 2 to 16, 2 to 12, 2 to 8, or 2 to 4 carbon atoms. The alkenyl group may have a linear, branched or cyclic structure, and may be optionally substituted with at least one substituent.

The term "aryl group" used herein may refer to, unless specifically defined otherwise, a monovalent residue having a benzene ring or derived from a compound including a structure in which at least two benzene rings are connected or condensed, or a derivative thereof. That is, in the range of the aryl group, an aralkyl group or arylalkyl group, in addition to an aryl group conventionally referred to as an aryl group, may be included. The aryl group may be an aryl group having 6 to 25, 6 to 21, 6 to 18, or 6 to 13 carbon atoms. The aryl group may be a phenyl group, a dichlorophenyl group, a chlorophenyl group, a phenylethyl group, a phenylpropyl group, a benzyl group, a tolyl group, a xylyl group, or a naphthyl group, and for example, is a phenyl group.

When the definition of the alkyl group is applied to the term "bivalent hydrocarbon group" of Formula 1, the lower limit of the number of carbon atoms may be 2.

In the average composition formula of Formula 1, the alkyl group having 1 to 4 carbon atoms may be a linear, branched or cyclic alkyl group. The alkyl group may be optionally substituted with at least one substituent. In the average composition formula of Formula 1, $R^2$ may be, for example, a methyl group.

In the specification, as a substituent capable of being optically substituted to a monovalent hydrocarbon group, an alkyl group, an alkenyl group or an aryl group, a halogen, an epoxy group, an acryloyl group, a methacryloyl group, an isocyanate group, a thiol group or the above-described monovalent hydrocarbon group (including one having 1 carbon atom) may be used, but the present application is not limited thereto.

In Formula 1, at least one of $R^1$, $R^3$ and $R^4$ may be an alkenyl group. In one example, the alkenyl group may be present in such an amount that a molar ratio (Ak/Si) of the alkenyl groups (Ak) with respect to a total of silicon atoms (Si) included in the organopolysiloxane (A) is 0.02 to 0.2 or 0.02 to 0.15. As the molar ratio (Ak/Si) is controlled to 0.02 or more, reactivity with another component may be suitably maintained, and a phenomenon of leaking a non-reacted component from a surface of a cured product may be prevented. In addition, as the molar ratio (Ak/Si) is controlled to 0.2 or less, crack resistance of the cured product may be excellently maintained.

In the average composition formula of Formula 1, a to d each refer to a molar ratio of a siloxane unit, and when the sum thereof (a+b+c+d) is adjusted to be 1, a may be 0.01 to 0.10 or 0.01 to 0.21, b may be 0 to 1.8 or 0 to 0.98, c may be 0.01 to 0.30, and d may be 0 to 0.3.

The organopolysiloxane represented as the average composition formula of Formula 1 may include a monofunctional siloxane unit (hereinafter referred to as an "M unit") which may be possibly and conventionally represented as $(R_3SiO_{1/2})$ in the related art, a D unit, a T unit and/or a tetrafunctional siloxane unit (hereinafter referred to as a "Q unit") which may be possibly represented as $(SiO_2)$, and for example, M, D and T units.

The organopolysiloxane (A) may have a structure derived from a T unit (hereinafter referred to as a "crosslinked structure") in its structure and a sufficiently long linear structure derived from a D unit. In the illustrative organopolysiloxane, b/c may be 5, 7, 8, or 10 or more in the average composition formula of Formula 1. In addition, in the average composition formula, b/a may be 5, 8, or 10 or more. Here, the upper limit of b/c may be, but is not particularly limited to, for example, 70, 60, 50, 40, 30, or 25. In addition, the upper limit of b/a may be, but is not particularly limited to, for example, 110, 100, 90, 80, 70, 60, 50, or 40. In Formula 1, b/(a+b+c+d) may be, for example, 0.5, 0.6, or 0.7 or more. The upper limit of b/(a+b+c+d) may be, but is not particularly limited to, less than 1 or 0.98 or less. In Formula 1, for example, b/(b+c) may be 0.5, 0.6, or 0.7 or more. The upper limit of b/(b+c) may be, but is not particularly limited to, less than 1 or 0.98 or less. When the organopolysiloxane has the above structure, suitable physical properties may be exhibited according to an application.

The organopolysiloxane having the average composition formula of Formula 1 may include at least one aryl group binding to a silicon atom. In the illustrative organopolysiloxane (A), a molar ratio (Ar/Si) of the aryl group (Ar) binding to the silicon atom with respect to a total of silicon atoms (Si) in the organopolysiloxane, may be 0.3, 0.5, or 0.7 or more. In this range, the organopolysiloxane may maintain excellent characteristics such as refractive index, light extraction efficiency, crack resistance, hardness and viscosity. Meanwhile, the upper limit of the molar ratio (Ar/Si) may be, for example, 1.5 or 1.3.

In one example, at least one aryl group binding to a silicon atom of the organopolysiloxane having the average composition formula of Formula 1 may bind to a silicon atom of a D unit. The illustrative organopolysiloxane may include at least one aryl group binding to a silicon atom of a D unit, and a molar ratio (Ar-D/Si) of the aryl group (Ar-D) binding to a silicon atom of a D unit with respect to a total of silicon atoms (Si) of the organopolysiloxane, may be 0.2, 0.4, or 0.6 or more. In one example, the upper limit of the molar ratio (Ar-D/Si) may be, but is not particularly limited to, for example, 1.8 or 1.5.

At least one of the aryl groups binding to a silicon atom of the organopolysiloxane having the average composition formula of Formula 1 may bind to a silicon atom of a T unit.

In one example, all of the aryl groups that bind to silicon atoms of the organopolysiloxane having the average composition formula of Formula 1 may bind to silicon atoms of D and/or T unit(s), and satisfy the above-described molar ratio (Ar/Si and/or Ar-D/Si). The organopolysiloxane or an encapsulant including the same may exhibit excellent characteristics such as refractive index, light extraction efficiency, crack resistance, hardness and viscosity.

In one example, the organopolysiloxane (A) may be a compound represented as an average composition formula of Formula 2.

$(R^5SiO_{3/2})_c$ [Formula 2]

In Formula 2, $R^1$, $R^2$ and $R^5$ are the same as defined in Formula 1, $R^6$ is an aryl group having 6 to 25 carbon atoms, $R^7$, $R^8$ and $R^9$ are each independently an alkyl group having 1 to 20 carbon atoms, an alkenyl group having 2 to 20 carbon atoms or an aryl group having 6 to 25 carbon atoms, at least one of $R^1$, $R^7$, $R^8$ and $R^9$ is an alkenyl group, and when a+l+m+c is adjusted to be 1, a is 0.01 to 0.10, l is 0 to 0.90, m is 0 to 0.90, and c is 0.01 to 0.30. However, (l+m)/a is 5 or more, and (l+m)/c is 5 or more.

In the average composition formula of Formula 2, a, l, m and c each refer to a molar ratio of a siloxane unit. Here, when the sum of (a+l+m+c) is adjusted to be 1, a is 0.01 to 0.10, l is 0 to 0.90, m is 0 to 0.90, and c is 0.01 to 0.30. In addition, here, the sum of l and m is represented as b in the empirical formula of Formula 1, and a, l, m and c may be controlled to satisfy the molar ratios described in the category of Formula 1. For example, in Formula 2, (l+m)/c may be 5, 7, 8, or 10 or more. In addition, in the average composition formula, (l+m)/a may be 5, 8, or 10 or more. Here, the upper limit of (l+m)/c may be, but is not particularly limited to, for example, 70, 60, 50, 40, 30, or 25. In addition, the upper limit of (l+m)/a may also be, but is not particularly limited to, for example, 110, 100, 90, 80, 70, 60, 50, or 40. In Formula 2, (l+m)/(a+l+m+c) may be, for example, 0.5, 0.6, or 0.7 or more. The upper limit of (l+m)/(a+l+m+c) may be, but is not particularly limited to, less than 1 or 0.98 or less. In Formula 2, (l+m)/(l+m+c) may be, for example, 0.5, 0.6, or 0.7 or more. The upper limit of (l+m)/(l+m+c) may be, but is not particularly limited to, less than 1 or 0.98 or less.

In addition, in the average composition formula of Formula 2, neither l nor m may be 0. When neither l nor m is 0, 1/m may be within a range of 0.4 to 2.0, 0.4 to 1.5, or 0.5 to 1.

In one example, the organopolysiloxane having the average composition formula of Formula 1 or 2 may include a unit of Formula 3 or 4.

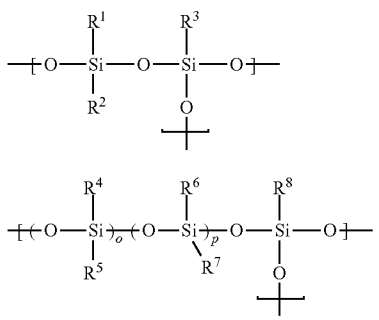

[Formula 3]

[Formula 4]

In Formulas 3 and 4, $R^1$ to $R^8$ are each independently an alkyl group having 1 to 20 carbon atoms, an alkenyl group having 2 to 20 carbon atoms or an aryl group having 6 to 25 carbon atoms, o is 0 to 300, and p is 0 to 300.

The illustrative organopolysiloxane may include at least one unit of Formula 3 or 4. The unit of Formula 3 or 4 is a unit in which a silicon atom of a D unit and a silicon atom of a T unit in a siloxane unit forming the organopolysiloxane are directly bound to each other via an oxygen atom. In one example, as described above, even when the organopolysiloxane is a mixture of at least two components and an average of compositions of respective components is represented as the average composition formula of Formula 1 or 2, the organopolysiloxane may include at least one of a single component having the unit of Formula 3 or 4. The organopolysiloxane including the unit of Formula 3 or 4 will be prepared, for example, by a reaction of a cyclic siloxane compound with an organopolysiloxane having a cage or partial cage structure or a T unit, as will be described below. Particularly, when the above method is applied, an organopolysiloxane including the unit of Formula 3 or 4 and the minimum number of silicon atoms bound with alkoxy and hydroxyl groups in its structure is possibly prepared.

In one example, the organopolysiloxane having the average composition formula of Formula 1 or 2 may have a ratio (OR/Ak) of an area (OR) of a peak derived from an alkoxy group binding to a silicon atom to an area (Ak) derived from an alkenyl group binding to a silicon atom of 0.05, 0.03, 0.01, or 0.005 or less, or 0 according to the spectrum obtained by $^1$H-NMR measurement. In this range, the organopolysiloxane may exhibit suitable viscosity, and excellently maintain other physical properties. In addition, here, the spectrum measured by $^1$H-NMR is specifically obtained according to a method to be described in the following illustrative embodiment.

In addition, in one example, the organopolysiloxane having the average composition formula of Formula 1 or 2 may have an acid value obtained by KOH titration of 0.05 mgKOH/g or less, 0.03 mgKOH/g or less, 0.01 mgKOH/g or less, or 0 mgKOH/g. In this range, the organopolysiloxane may exhibit suitable viscosity, and excellently maintain other physical properties. In addition, here, the acid value obtained by the KOH titration is determined according to a method to be described in the following illustrative embodiment.

In one example, the organopolysiloxane having the average composition formula of Formula 1 or 2 may have a viscosity at 25° C. of 2,000, 3,000, 4,000, 5,000, 7,000, 9,000, or 9,500 cP or more. In this range, processibility and hardness of the organopolysiloxane may be suitably maintained. Meanwhile, the upper limit of the viscosity is not particularly limited, and for example, the viscosity may be 100,000, 90,000, 80,000, 70,000, or 65,000 cP or less.

In one example, the organopolysiloxane having the average composition formula of Formula 1 or 2 may have a weight average molecular weight (Mw) of 1,500, 2,000, 3,000, 4,000, or 5,000 or more. The term "weight average molecular weight" used herein refers to a conversion value with respect to standard polystyrene measured by gel permeation chromatography (GPC). In addition, unless specifically defined otherwise in the specification, the term "molecular weight" may refer to a weight average molecular weight. In this range, moldability, hardness and strength of the organopolysiloxane may be suitably maintained. Meanwhile, the upper limit of the molecular weight is not particularly limited, and may be 14,000, 12,000, or 10,000 or less.

The organopolysiloxane may be, for example, a reaction product of a mixture including a cyclic siloxane compound and an organopolysiloxane including a cage structure or partial cage structure or a T unit. As the cyclic siloxane compound, a compound represented by Formula 5 may be used. In addition, the organopolysiloxane including a cage or partial cage structure or a T unit may be represented as an average composition formula of Formula 6 or 7.

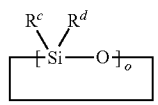

[Formula 5]

[$R^eSiO_{3/2}$]                                                                [Formula 6]

[$R^aR^b{}_2SiO_{1/2}]_p[R^eSiO_{3/2}]_q$                              [Formula 7]

In Formulas 5 to 7, $R^a$ is a monovalent hydrocarbon group having at least two carbon atoms, $R^b$ is an alkyl group having 1 to 4 carbon atoms, $R^c$ to $R^e$ are each independently an aryl group having 6 to 25 carbon atoms, an alkyl group having 1 to 20 carbon atoms or an alkenyl group having 2 to 20 carbon atoms, o is 3 to 6, p is 1 to 3, and q is 1 to 10.

In Formulas 5 to 7, specific kinds of $R^a$, $R^c$, $R^d$ and $R^e$, specific values of o, p and q, and a ratio of respective components in the mixture may be determined according to an organopolysiloxane having a desired structure.

When the mixture including the compound of Formula 5 and the organopolysiloxane having the average composition formula (s) of Formula 6 and/or 7 is reacted, the organopolysiloxane having a desired structure, for example, having the above-described partially-crosslinked structure, may be synthesized at a sufficient molecular weight.

When the mixture is reacted as described above, a desired product having minimum functional groups such as an alkoxy or hydroxyl group binding to a silicon atom in the synthesized organopolysiloxane and thus exhibiting excellent physical properties may be prepared.

In one example, the mixture may further include a compound represented by Formula 8.

$(R^aR^b{}_2Si)_2O$                                                             [Formula 8]

In Formula 8, $R^a$ is a monovalent hydrocarbon group having at least two carbon atoms, and $R^b$ is an alkyl group having 1 to 4 carbon atoms.

In Formula 8, specific kinds of $R^a$ and $R^b$ and a mixing ratio of the mixture may be determined according to a desired structure of an organopolysiloxane.

In one example, the reaction of respective components in the mixture may be performed in the presence of a suitable catalyst. Therefore, the mixture may further include a catalyst. As a catalyst capable of being included in the mixture, for example, a base catalyst may be used. A suitable base catalyst may be, but is not limited to, a metal hydroxide such as KOH, NaOH or CsOH; a metal silanolate including an alkali metal compound and a siloxane; or a quaternary ammonium compound such as tetramethylammonium hydroxide, tetraethylammonium hydroxide or tetrapropylammonium hydroxide.

A ratio of the catalyst in the mixture may be suitably selected in consideration of desired reactivity, and for example, may be 0.01 to 30 parts by weight, or 0.03 to 5 parts by weight with respect to 100 parts by weight of a total weight of the reaction products in the mixture. In the specification, unless specifically defined otherwise, a unit "parts by weight" refers to a weight ratio between components.

In one example, the reaction may be performed in the presence of a suitable solvent. As a solvent, the reaction product in the mixture, that is, a disiloxane or organopolysiloxane, may be suitably mixed with a catalyst, and any kind of solvent that does not interfere with reactivity may be used. The solvent may be, but is not limited to, an aliphatic hydrocarbon-based solvent such as n-pentane, i-pentane, n-hexane, i-hexane, 2,2,4-trimethyl pentane, cyclohexane or methylcyclohexane; an aromatic solvent such as benzene, toluene, xylene, trimethyl benzene, ethyl benzene or methylethyl benzene; a ketone-based solvent such as methylethylketone, methylisobutylketone, diethylketone, methyl n-propyl ketone, methyl n-butyl ketone, cyclohexanone, methylcyclohexanone or acetylacetone; an ether-based solvent such as tetrahydrofuran, 2-methyl tetrahydrofuran, ethyl ether, n-propyl ether, isopropyl ether, diglyme, dioxine, dimethyldioxine, ethyleneglycol monomethyl ether, ethyleneglycol dimethyl ether, ethyleneglycol diethyl ether, propyleneglycol monomethyl ether or propyleneglycol dimethyl ether; an ester-based solvent such as diethyl carbonate, methyl acetate, ethyl acetate, ethyl lactate, ethyleneglycol monomethylether acetate, propyleneglycol monomethylether acetate or ethyleneglycol diacetate; or an amide-based solvent such as N-methylpyrrolidone, formamide, N-methyl formamide, N-ethyl formamide, N,N-dimethyl acetamide or N,N-diethylacetamide.

The reaction may be performed by adding the catalyst to the reaction product. Here, a reaction temperature may be controlled within a range of, for example, 0 to 150° C., or 30 to 130° C. In addition, a reaction time may be controlled within a range of, for example, 1 hour to 3 days.

The organopolysiloxane (B) included in the curable composition includes an alkenyl group, an aryl group, and an epoxy group. Due to the organopolysiloxane (B), an adhesive property of the curable composition or a cured product thereof may be enhanced.

The term "epoxy group" used herein may refer to, unless specifically defined otherwise, a monovalent residue induced from a cyclic ether having three ring-forming atoms, or a compound including the cyclic ether. The epoxy group may be a glycidyl group, an epoxyalkyl group, a glycidoxyalkyl group, or an alicyclic epoxy group. An alkyl group in the epoxy group may be a linear, branched or cyclic alkyl group having 1 to 20, 1 to 16, 1 to 12, 1 to 8, or 1 to 4 carbon atoms. In addition, the alicyclic epoxy group may refer to a monovalent residue having an aliphatic hydrocarbon ring structure, and may be derived from a compound including a structure in which two carbon atoms forming the aliphatic hydrocarbon ring also form an epoxy group. The alicyclic epoxy group may be an alicyclic epoxy group having 6 to 12 carbon atoms, for example, a 3,4-epoxycyclohexylethyl group.

As the organopolysiloxane (B), an organopolysiloxane having an average composition formula of Formula 9 may be used.

$$(R_3SiO_{1/2})_q(R_2SiO_{2/2})_r(RSiO_{3/2})_s(SiO_{4/2})_t \quad \text{[Formula 9]}$$

In Formula 9, R is each independently an epoxy group or a monovalent hydrocarbon group, at least one of R is an alkenyl group, at least one of R is an epoxy group, at least one of R is an aryl group, q, r, s and t are each 0 or a positive number, $(s+t)/(q+r+s+t)$ is 0.2 to 0.7, and $s/(s+t)$ is 0.8 or more.

In Formula 9, at least one or two of R may be an alkenyl group. In one example, the alkenyl group may be present in such an amount that a molar ratio (Ak/Si) of the alkenyl groups (Ak) with respect to a total of silicon atoms (Si) included in the compound (B) is 0.05 to 0.35 or 0.05 to 0.3. In the above molar ratio (Ak/Si), a cured product exhibiting excellent reactivity with respect to another component of the curable composition, and having excellent adhesive strength after curing, and an excellent physical property, such as shock resistance, may be provided.

In Formula 9, at least one of R is also an epoxy group. Accordingly, due to the epoxy group, the organopolysiloxane (B) may suitably maintain strength and scratch resistance of the cured product, and exhibit an excellent adhesive property to a base. In one example, the epoxy group may be present in such an amount that a molar ratio (Ep/Si) of the epoxy group (Ep) with respect to a total of silicon atoms (Si) included in the organopolysiloxane (B) is 0.05, 0.15, 0.3, or 0.5 or more. In the molar ratio (Ep/Si), a crosslinked structure of the cured product may be suitably maintained, and characteristics such as thermal resistance and an adhesive property may be excellently maintained. The upper limit of the molar ratio (Ep/Si) may be, but is not particularly limited to, for example, 0.7.

In Formula 9, at least one of R may be an aryl group. Accordingly, the refractive index and hardness of the cured product may be effectively controlled. The aryl group may be present in such an amount that a molar ratio (Ar/Si) of the aryl group (Ar) with respect to a total of silicon atoms (Si) included in the compound (B) is 0.2 to 1.0, or 0.25 to 1.0. As the molar ratio (Ar/Si) is controlled to 0.2 or 0.25 or more, compatibility with another component is excellent, and the refractive index and hardness of the cured product may be maximized. In addition, as the molar ratio (Ar/Si) is controlled to 1.0 or less, the viscosity and thermal and shock resistance of the composition may be suitably maintained.

In the average composition formula of Formula 9, q, r, s and t are molar ratios of respective siloxane units, and when the sum thereof is adjusted to be 1, q is 0 to 0.7, r is 0 to 0.5, s is 0 to 0.8 and t is 0 to 0.2. Here, s and t are not simultaneously 0. To maximize strength, crack resistance and thermal and shock resistance of the cured product, and provide a cured product having excellent adhesive strength to a base, here, $(s+t)/(q+r+s+t)$ may be 0.2 to 0.7, and $s/(s+t)$ may be controlled to 0.8 or more. Here, the upper limit of $s/(s+t)$ is not particularly limited, and for example, the upper limit may be 1.0.

The organopolysiloxane (B) may have a viscosity at 25° C. of 100, 300, 500, 1,000, 2,000, 3,000, 4,000, 5,000, 6,000, 7,000, 8,000, 9,000, or 100,000 cP or more, and therefore processibility before curing and hardness after curing may be suitably maintained.

The organopolysiloxane (B) may have, for example, a molecular weight of 1,000 or more. As the molecular weight is controlled to 1,000 or more, a cured product having excellent processibility and workability before curing, and excellent crack resistance, thermal and shock resistance and an adhesive property to a base after curing, may be provided. The upper limit of the molecular weight may be, but is not particularly limited to, for example, 5,000. Here, the molecular weight of the compound (B) may be a weight average molecular weight, or the molecular weight of a conventional compound.

A method of preparing the organopolysiloxane (B) is not particularly limited, and may be, for example, a method of preparing an organopolysiloxane conventionally known, or a method similar to that of preparing the organopolysiloxane (A).

The organopolysiloxane (B) may be included at, for example, 0.1 to 30, 0.1 to 20, 1 to 20, 1 to 15, or 1 to 10 parts by weight based on 100 parts by weight of the organopolysiloxane (A). In addition, when the curable composition includes the compounds (C) and (D) which will be described later, the organopolysiloxane (B) may be included in the composition at 0.1 to 30, 0.1 to 20, 0.2 to 10, or 0.5 to 5 parts by weight with respect to 100 parts by weight of a total weight of the compounds (A), (C) and (D). In the above range, a composition having excellent compatibility with the resin before curing, and excellent transparency, water resistance and thermal and shock resistance after curing, may be provided.

The curable composition may further include (C) an organopolysiloxane having a crosslinked structure (hereinafter, referred to as an "organopolysiloxane (C)").

The term "crosslinked structure" used herein may refer to an organopolysiloxane including a T unit, or at least one unit of tetrafunctional siloxane units (hereinafter referred to as a "Q units") possibly and conventionally represented as (SiO$_2$), that is, an organopolysiloxane not corresponding to that having a partially-crosslinked structure.

In one example, the organopolysiloxane (C) may be represented as an average composition formula of Formula 10.

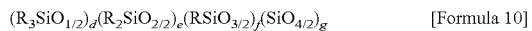

$(R_3SiO_{1/2})_d(R_2SiO_{2/2})_e(RSiO_{3/2})_f(SiO_{4/2})_g$      [Formula 10]

In Formula 10, R is each independently a monovalent hydrocarbon group or an epoxy group. However, at least one of R is an alkenyl group, at least one of R is an aryl group, and when d+e+f+g is adjusted to be 1, d is 0.05 to 0.5, e is 0 to 0.3, f is 0.6 to 0.95, and g is 0 to 0.2. Here, (d+e)/(d+e+f+g) is 0.2 to 0.7, e/(e+f+g) is 0.3 or less, and f/(f+g) is 0.8 or more.

In Formula 10, one or at least two of R may be alkenyl groups. In one example, the alkenyl group may be present in such an amount that a molar ratio (Ak/Si) of the alkenyl group (Ak) with respect to a total of silicon atoms (Si) included in organopolysiloxane (C) is 0.05 to 0.4 or 0.05 to 0.35. As the molar ratio (Ak/Si) is controlled to 0.05 or more, reactivity with another component may be suitably maintained, and a phenomenon of leaking a non-reacted component from a surface of a cured product may be prevented. In addition, as the molar ratio (Ak/Si) is controlled to 0.4 or 0.35 or less, hardness, crack resistance and thermal and shock resistance of the cured product may be excellently maintained.

In Formula 10, at least one of R may be an aryl group. Accordingly, the refractive index and hardness of the cured product may be effectively controlled. The aryl group may be present at such an amount that a molar ratio (Ar/Si) of the aryl group (Ar) with respect to a total of silicon atoms (Si) included in the organopolysiloxane (C) is 0.5 to 1.5 or 0.5 to 1.2. As the molar ratio (Ar/Si) is controlled to 0.5 or more, the refractive index and hardness of the cured product may be maximized, and as the molar ratio (Ar/Si) is controlled to 1.5 or 1.2 or less, the viscosity and thermal and shock resistance of the composition may be suitably maintained.

In the average composition formula of Formula 10, d, e, f and g refer to molar ratios of respective siloxane units, and when the sum thereof is adjusted to be 1, d is 0.05 to 0.5, e is 0 to 0.3, f is 0.6 to 0.95, and g is 0 to 0.2. However, f and g are not simultaneously 0. To maximize the strength, crack resistance and thermal and shock resistance of the cured product, here, (d+e)/(d+e+f+g) may be controlled to 0.2 to 0.7, e/(e+f+g) may be controlled to 0.3 or less, and f/(f+g) may be controlled to 0.8 or more. Here, the lower limit of e/(e+f+g) may be, but is not particularly limited to, for example, more than 0. In addition, here, the upper limit of f/(f+g) may be, but is not particularly limited to, for example, 1.0.

The organopolysiloxane (C) may have a viscosity at 25° C. of 5,000 or 10,000 cP or more, and therefore processibility before curing and hardness after curing may be suitably maintained.

The organopolysiloxane (C) may have a molecular weight of, for example, 800 to 20,000 or 800 to 10,000. As the molecular weight is controlled to 800 or more, moldability before curing or strength after curing may be effectively maintained, and as the molecular weight may be controlled to 20,000 or 10,000 or less, viscosity may be maintained at a suitable level.

A method of preparing the organopolysiloxane (C) is not particularly limited, but a preparing method conventionally known in the related art, or a similar method to that for preparing the organopolysiloxane (A), may be employed.

For example, the organopolysiloxane (C) may be mixed at 50 to 1,000 or 50 to 700 parts by weight with respect to 100 parts by weight of the organopolysiloxane (A). As the weight ratio of the organopolysiloxane (C) is controlled to 50 parts by weight or more, strength of a cured product may be excellently maintained, and the weight ratio of the organopolysiloxane (C) is controlled to 1,000 or 700 parts by weight or less, crack resistance and thermal and shock resistance may be excellently maintained.

The curable composition may further include (D) a linear organopolysiloxane (hereinafter referred to as "compound (D)").

The compound (D) may serve as a crosslinking agent crosslinking the curable composition. As the compound (D), various kinds of compounds including a hydrogen atom (Si—H) binding to a silicon atom may be used. The compound (D) may be a linear, branched, cyclic or crosslinkable organopolysiloxane, and may be a compound having 2 to 1000, or 3 to 300 silicon atoms.

In one example, the compound (D) may be a compound of Formula 11, or a compound represented as average composition formula of Formula 12.

$R^{15}_3SiO(R^{15}_2SiO)_nSiR^{15}_3$      [Formula 11]

In Formula 11, $R^{15}$'s are each independently a hydrogen atom or a monovalent hydrocarbon group, with the proviso that one or at least two of $R^{15}$'s is the hydrogen atoms and at least one of $R^{15}$'s is an aryl group; and n is 1 to 100.

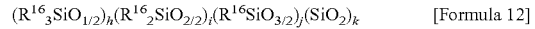

$(R^{16}_3SiO_{1/2})_h(R^{16}_2SiO_{2/2})_i(R^{16}SiO_{3/2})_j(SiO_2)_k$      [Formula 12]

In Formula 12, $R^{16}$'s are each independently a hydrogen atom or a monovalent hydrocarbon group, with the proviso that one or at least two of $R^{16}$'s is the hydrogen atom and at least one of $R^{16}$'s is an aryl group; and when h+i+j+k is adjusted to be 1, h is 0.1 to 0.8, i is 0 to 0.5, j is 0.1 to 0.8, and k is 0 to 0.2.

The compound of Formula 11 may be a linear organopolysiloxane having at least two hydrogen atoms binding to a silicon atom, and in Formula 11, n may be 1 to 100, 1 to 50, 1 to 25, 1 to 10, or 1 to 5.

In one example, a molar ratio (H/Si) of hydrogen atoms (H) binding to silicon atoms with respect to a total of silicon atoms (Si) included in the compound (D) may be 0.2 to 0.8 or 0.3 to 0.75. As the molar ratio is controlled to 0.2 or 0.3 or more, curability of the composition may be excellently maintained, and as the molar ratio is controlled to 0.8 or 0.75 or less, crack resistance and thermal and shock resistance may be excellently maintained.

In addition, the compound (D) may include at least one aryl group, and therefore, at least one of R in Formula 11 or at least one of R in Formula 12 may be an aryl group. Accordingly, a refractive index and hardness of the cured product may be effectively controlled. The aryl group may be present at such an amount that a molar ratio (Ar/Si) of the aryl groups (Ar) with respect to a total of silicon atoms (Si) included in the compound (D) is 0.5 to 1.5 or 0.5 to 1.3. As the molar ratio (Ar/Si) is controlled to 0.5 or more, a refractive index and hardness of the cured product may be maximized, and as the molar ratio (Ar/Si) is controlled to 1.5 or 1.3 or less, a viscosity and crack resistance of the composition may be suitably maintained.

The compound (D) may have a viscosity at 25° C. of 0.1 to 100,000, 0.1 to 10,000, 0.1 to 1,000, or 0.1 to 300 cP. As the compound (D) has the above viscosity, processibility of the composition and hardness of the cured product may be excellently maintained.

The compound (D) may have a molecular weight of, for example, less than 2,000, 1,000, or 800. When the molecular weight of the compound (D) is 1,000 or more, strength of the cured product may be degraded. The lower limit of the molecular weight of the compound (D) is not particularly limited, and may be, for example, 250. In the compound (D), the molecular weight may refer to a weight average molecular weight, or a conventional molecular weight of the compound.

A method of preparing the compound (D) is not particularly limited, and for example, may employ a preparing method conventionally known in the related art, or a similar method to that for preparing organopolysiloxane (A).

In one example, a content of the compound (D) may be determined according to an amount of an alkenyl group having a different component in the curable composition such as organopolysiloxane (A). In one example, the compound (D) may be selected in such a range that a molar ratio (H/Ak) of hydrogen atoms (H) binding to a silicon atoms included in the compound (D) with respect to a total of alkenyl groups (Ak) included in the curable composition, is 0.5 to 2.0 or 0.7 to 1.5. Here, the alkenyl group included in the curable composition, for example, may be an alkenyl group included in the component(s) (A), (B) and/or (C). In the molar ratio (H/Ak), a composition exhibiting excellent processibility and workability before curing, excellent crack resistance, hardness, thermal and shock resistance and an adhesive property after curing, and having no whitening or surface stickiness under severe conditions, may be provided. A content of the compound (D) may be, for example, 50 to 500 or 50 to 400 parts by weight with respect to 100 parts by weight of the compound (A).

In one example, components included in the curable composition may all include an aryl group binding to a silicon atom. In this case, a molar ratio (Ar/Si) of a total of aryl groups (Ar) included in the curable composition with respect to a total of silicon atoms (Si) included in the curable composition, may be 0.5 or more. A total of silicon atoms or aryl groups included in the curable composition may be silicon atoms or aryl groups included in the component(s) (A), (B), (C) and/or (D). As the molar ratio (Ar/Si) is controlled to 0.5 or more, light transmittance, refractive index, viscosity, crack resistance and hardness of the cured product may be maximized. Here, the upper limit of the molar ratio (Ar/Si) of the aryl group is not particularly limited, and may be, for example, 2.0 or 1.5.

The curable composition may include particles, for example, inorganic particles. The inorganic particles may have a refractive index in a range in which an absolute value of a difference in refractive index between the composition and the cured product is 0.15 or less.

The particles may prevent a problem of precipitating a fluorescent material in a curing operation when the fluorescent material is mixed into the composition, or improve overall reliability by enhancing thermal resistance, protection against heat and crack resistance. In addition, the particles may serve as described above due to the above range of the refractive index, and maintain transparency of the composition or cured product, thereby enhancing brightness when applied to a device.

As the particles, various kinds of particles used in the related art having the absolute value of the difference in refractive index between the composition excluding the particles and the cured product thereof of 0.15 or less, may be used. The particles may have the absolute value of the difference in refractive index between the composition excluding the particles and the cured product thereof of 0.1, or 0.07 or less. For example, the particles may be silica ($SiO_2$), organosilica, alumina, alumino silica, titania, zirconia, cesium oxide, hafnium oxide, niobium pentoxide, tantalum pentoxide, indium oxide, tin oxide, indium tin oxide, zinc oxide, silicon, zinc sulfide, calcium carbonate, barium sulfate, aluminosilicate or magnesium oxide, and may be porous or hollow particles.

The particles may have an average diameter of, for example, 1 nm to 50 μm or 2 nm to 10 μm. When the average diameter is 1 nm or more, the particles may be uniformly dispersed in the composition or cured product thereof, and when the average diameter is 50 μm or less, the dispersion of the particles may be effectively performed, and precipitation of the particles may be prevented.

The particles may be included at 0.1 to 30 or 0.2 to 10 parts by weight with respect to 100 parts by weight of the compound (A). When the content of the particles is 0.1 parts by weight or more, excellent inhibition of the precipitation of a phosphor or enhancement of reliability of the device may be ensured, and when the content of the particles is 30 parts by weight or less, processibility may be excellently maintained.

The composition may further include a hydrosilylation catalyst. As a hydrosilylation catalyst, all conventional components known in the related art may be used. As such a catalyst, a platinum-, palladium- or rhodium-based catalyst may be used. In the specification, a platinum-based catalyst may be used in consideration of catalyst efficiency, and may be, but is not limited to, chloroplatinic acid, platinum tetrachloride, an olefin complex of platinum, an alkenyl siloxane complex of platinum or a carbonyl complex of platinum.

A content of the hydrosilylation catalyst is not particularly limited as long as the hydrosilylation catalyst is included at a catalytic amount, that is, an amount capable of serving as a catalyst. Conventionally, the hydrosilylation catalyst may be used at 0.1 to 500 ppm or 0.2 to 100 ppm based on an atomic weight of platinum, palladium or rhodium.

Another aspect of the present application provides a semiconductor device. The illustrative semiconductor device may be encapsulated by an encapsulant including a cured product of the curable composition.

Examples of a semiconductor device encapsulated by an encapsulant include a diode, a transistor, a thyristor, a photocoupler, a CCD, a solid-phase image pick-up diode, a monolithic IC, a hybrid IC, an LSI, a VLSI or a light-emitting diode (LED).

In one example, the semiconductor device may be an LED.

The LED may be one formed by stacking a semiconductor material on a substrate. The semiconductor material may be, but is not limited to, GaAs, GaP, GaAlAs, GaAsP, AlGaInP, GaN, InN, AlN, InGaAlN or SiC. In addition, as the substrate, sapphire, spinel, SiC, Si, ZnO or GaN monocrystal may be used.

In addition, to prepare the LED, when necessary, a buffer layer may be formed between a substrate and a semiconductor material. As a buffer layer, GaN or AlN may be used. A method of stacking a semiconductor material on a substrate may be, but is not particularly limited to, MOCVD, HDVPE or liquid growth. In addition, a structure of the LED may be, for example, a monojunction including an MIS junction, a PN junction, and a PIN junction, a heterojunction, or a double heterojunction. In addition, the LED may be formed using a mono or multiple quantum well structure.

In one example, an emission wavelength of the LED may be, for example, 250 to 550 nm, 300 to 500 nm, or 330 to 470 nm. The emission wavelength may refer to a main emission peak wavelength. As the emission wavelength of the LED is set in the above range, a white LED having a longer life span, high energy efficiency and high color expression may be obtained.

The LED may be encapsulated using the composition. In addition, the encapsulation of the LED may be performed only using the composition, and in some cases, another encapsulant may be used in combination with the composition. When two kinds of encapsulants are used in combination, after the encapsulation using the composition, the encapsulated LED may also be encapsulated with another encapsulant, or the LED may be encapsulated with another encapsulant and then encapsulated again with the composition. As another encapsulant, an epoxy resin, a silicon resin, an acryl resin, a urea resin, an imide resin, or glass may be used.

To encapsulate the LED with the composition, for example, a method including previously injecting the composition into a mold, dipping a read frame to which the LED is fixed therein and curing the composition, or a method including injecting the composition into a mold into which the LED is inserted and curing the composition may be used. As a method of injecting the composition, injection by a dispenser, transfer molding, or injection molding may be used. In addition, as other encapsulating methods, a method of dropping the composition on the LED, coating the composition by screen printing or using a mask, and curing the composition, and a method of injecting the composition into a cup in which the LED is disposed on its bottom by a dispenser and curing the composition may be included.

In addition, the composition may be used as a diamond material fixing the LED to a read terminal or package, or a passivation layer or package substrate on the LED when necessary.

When it is necessary to cure the composition, the curing is not particularly limited, and may be performed, for example, by maintaining the composition at a temperature of 60 to 200° C. for 10 minutes to 5 hours, or in phases with at least two steps at a suitable temperature and for a suitable amount of time.

A shape of the encapsulant is not particularly limited, and for example, may be a bullet-type lens, plane, or thin film shape.

In addition, additional enhancement of performance of the LED may be promoted according to the conventional method known in the related art. To enhance performance, for example, a method of disposing a reflective layer or light collecting layer on a back surface of the LED, a method of forming a complementary coloring part on its bottom, a method of disposing a layer absorbing light having a shorter wavelength than the main emission peak on the LED, a method of encapsulating the LED and further molding the LED with a lightweight material, a method of inserting the LED into a through hole to be fixed, or a method of contacting the LED with a read member by flip-chip contact to extract light from a direction of the substrate, may be used.

The LED may be effectively applied to, for example, backlights for liquid crystal displays (LCDs), lights, various kinds of sensors, light sources of a printer and a copy machine, light sources for a mobile gauge, signal lights, pilot lights, display devices, light sources of planar-type LEDs, displays, decorations, or various kinds of lightings.

Effect

Illustrative curable composition exhibits excellent processibility and workability. In addition, the curable composition exhibits excellent light extraction efficiency, crack resistance, hardness, thermal and shock resistance and an adhesive property after curing. In addition, the composition may provide an encapsulant exhibiting stable durability and reliability under severe conditions for a long time and having no whitening and surface stickiness.

DETAILED DESCRIPTION OF ILLUSTRATIVE EMBODIMENTS

Hereinafter, a curable composition according to the present application will be described in further detail with reference to Examples according to the present application and Comparative Examples not according to the present application, but the scope of the present application is not limited to the following Examples.

Hereinafter, the abbreviation "Vi" refers to a vinyl group, the abbreviation "Ph" refers to a phenyl group, the abbreviation "Me" refers to a methyl group, and the abbreviation "Ep" refers to a 3-glycidoxypropyl group.

In addition, physical properties are measured by the following methods:

1. Measurement of $^1$H-NMR for Organopolysiloxane $^1$H-NMR measurement was performed using Varian Unity Inova 500 MHz NMR. A solvent was aceton-$d_6$, and measuring conditions were as follows:

Pulse sequence: s2pul
Sweep width: 8012.8 Hz
Acquisition time: 2.045 seconds
Delay time: 2 seconds
Pulse width: 45 degree pulse (8.10 μsec)
Number of scan: 16

2. Measurement of Acid Value for Organopolysiloxane

A solvent for measurement was prepared by mixing 500 mL of toluene, 495 mL of isopropylalcohol (IPA) and 5 mL of distilled water. In addition, a 0.1 N KOH solution (solvent: IPA) was prepared as a base solution, and alpha-naphtholbenzein (pH: 0.8~8.2 yellow, 10.0 blue green) was prepared as an indicator. Subsequently, after approximately 1 to 2 g of a sample was taken and dissolved in 6 g of the solvent for measurement, the indicator was added thereto and then the resulting mixture was titrated using the base solution. An acid value was measured using an amount of the base solution used at a time to complete the titration in units of mg KOH/g.

3. Evaluation of Surface Stickiness

A curable composition was injected into a mold, and cured at 150° C. for 1 hour. Subsequently, a surface of the prepared cured product was touched by hand, and surface stickiness was evaluated according to the following criteria:

<Criteria for Evaluating Surface Stickiness>
○: the surface was not sticky
Δ: the surface was a little sticky
x: the surface was very sticky 4. Evaluation of Characteristics of Device Characteristics of a device were evaluated using a 6020 LED package prepared with polyphthalamide (PPA). Particularly, the curable composition was dispensed in a PPA cup, maintained at 70° C. for 30 minutes, cured at 150° C. for 1 hour, and thereby a surface-mounted LED was manufactured. Afterward, a thermal and shock test and a long-term reliability test were performed according to the following methods.

(1) Thermal and Shock Test

The manufactured LED was maintained at −40° C. for 30 minutes, and then maintained at 100° C. for 30 minutes, which was set as one cycle, and then the cycle was repeated 10 times. The LED was maintained at room temperature, and then thermal and shock resistance thereof was evaluated by examining a peeling state. In the evaluation, 10 LEDs manufactured with the same curable composition were each subjected to the above-described test, and the number of peeled LEDs is shown in Table 1 (the number of peeled LEDs/the number of a total of LEDs (10)).

(2) Long-Term Reliability Test

The manufactured LED was operated for 200 hours while 30 mA of current was supplied under conditions of 85° C. and a relative humidity of 85%. Subsequently, a reduction ratio of late brightness after the operation to initial brightness before the operation, was measured and evaluated according to the following criteria.

<Evaluation Criteria>
○: reduction ratio of brightness to initial brightness of 10% or less
x: reduction ratio of brightness to initial brightness of more than 10%

Synthesis Example 1

55.00 g of octamethylcyclotetrasiloxane, 120.4 g of octaphenylcyclotetrasiloxane, 9.6 g of tetramethyltetravinylcyclotetrasiloxane, 17.4 g of octaphenyl-polyhedral oligomeric silsesquioxane (octaphenyl-POSS) and 15.7 g of divinyltetramethyldisiloxane were mixed, and 0.6 mL of tetramethylammonium hydroxide (TMAH) was mixed into the mixture as a catalyst. Afterward, the mixture into which the catalyst was mixed was reacted at 115° C. for approximately 20 hours. A low molecular weight material was removed from the reaction product after reaction, thereby obtaining a transparent oil-type organopolysiloxane (A) represented by Formula A. The organopolysiloxane had a viscosity at 25° C. of 35,200 cP and a molecular weight of approximately 5,100. In addition, from the spectrum measured by $^1$H-NMR for the organopolysiloxane, a peak derived from an alkoxy group was not observed, and an acid value was measured at approximately 0.008.

$[ViMe_2SiO_{1/2}]_2[Me_2SiO_{2/2}]_{18}[Ph_2SiO_{2/2}]_{15}[ViMeSiO_{2/2}]_3[PhSiO_{3/2}]_2$      [Formula A]

Synthesis Example 2

An organopolysiloxane was synthesized by the method described in Synthesis Example 1, except that tetramethyltetravinylcyclotetrasiloxane was not used, and amounts at which octaphenyl-POSS and divinyltetramethyldisiloxane were mixed were changed to 8.7 g and 12.6 g, respectively. The organopolysiloxane was represented by Formula B, and present in transparent oil. The organopolysiloxane (B) had a viscosity at 25° C. of 19,600 cP and a molecular weight of approximately 5,000. In addition, from the spectrum measured by $^1$H-NMR for the organopolysiloxane, a peak derived from an alkoxy group was not observed, and an acid value was measured at approximately 0.009.

$[ViMe_2SiO_{1/2}]_2[Me_2SiO_{2/2}]_{20}[Ph_2SiO_{2/2}]_{16}[PhSiO_{3/2}]_2$      [Formula B]

Synthesis Example 3

60.00 g of octamethylcyclotetrasiloxane, 106.96 g of octaphenylcyclotetrasiloxane, 17.44 g of octaphenyl-POSS and 12.56 g of divinyltetramethyldisiloxane were mixed, and 0.63 mL of tetramethylammonium hydroxide (TMAH) was mixed into the mixture as a catalyst. Afterward, the mixture into which the catalyst was mixed was reacted at 115° C. for approximately 20 hours, thereby obtaining a transparent oil-type polysiloxane represented by Formula C. The organopolysiloxane had a viscosity at 25° C. of 21,000 cP and a molecular weight of approximately 6,400. In addition, from the spectrum measured by $^1$H-NMR for the organopolysiloxane, a peak derived from an alkoxy group was not observed, and an acid value was measured at approximately 0.006 mg KOH/g.

$[ViMe_2SiO_{1/2}]_2[Me_2SiO_{2/2}]_{22}[Ph_2SiO_{2/2}]_{15}[PhSiO_{3/2}]_5$      [Formula C]

Synthesis Example 4

A polysiloxane was synthesized by the method described in Synthesis Example 3, except that the amount at which divinyltetramethyldisiloxane was mixed was changed to 6.28 g. The polysiloxane was represented by Formula D and present in transparent oil. The polysiloxane had a viscosity at 25° C. of 58,600 cP and a molecular weight of approximately 9,700. In addition, in the spectrum measured by $^1$H-NMR, a peak derived from an alkoxy group was not observed, and an acid value was measured at approximately 0.009 mg KOH/g.

$[ViMe_2SiO_{1/2}]_2[Me_2SiO_{2/2}]_{40}[Ph_2SiO_{2/2}]_{27}[PhSiO_{3/2}]_9$      [Formula D]

Synthesis Example 5

A polysiloxane was synthesized by the method described in Synthesis Example 3, except that the amounts at which octaphenyl-POSS and divinyltetramethyldisiloxane were mixed were changed to 34.88 g and 15.72 g, respectively. The polysiloxane was represented by Formula E and present in transparent oil. The polysiloxane had a viscosity at 25° C. of 33,200 cP and a molecular weight of approximately 4,600. In addition, in the spectrum measured by $^1$H-NMR, a peak derived from an alkoxy group was not observed, and an acid value was measured at approximately 0.008 mg KOH/g.

$[ViMe_2SiO_{1/2}]_2[Me_2SiO_{2/2}]_{19}[Ph_2SiO_{2/2}]_{12}[PhSiO_{3/2}]_6$      [Formula E]

Synthesis Example 6

A polysiloxane was synthesized by the method described in Synthesis Example 3, except that the amounts at which octamethylcyclotetrasiloxane, octaphenylcyclotetrasiloxane and divinyltetramethyldisiloxane were mixed were changed to 55.00 g, 120.34 g and 18.85 g, respectively. The polysiloxane was represented by Formula F and present in transparent oil. The polysiloxane had a viscosity at 25° C. of 24,400 cP and a molecular weight of approximately 4,200. In addition, in the spectrum measured by ¹H-NMR, a peak derived from an alkoxy group was not observed, and an acid value was measured at approximately 0.008 mg KOH/g.

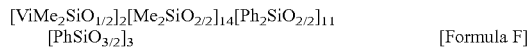

[Formula F]

Synthesis Example 7

A polysiloxane was synthesized by the method described in Synthesis Example 6, except that the amount at which divinyltetramethyldisiloxane was mixed was changed to 12.56 g. The polysiloxane was represented by Formula G and present in transparent oil. The polysiloxane had a viscosity at 25° C. of 47,000 cP and a molecular weight of approximately 5,500. In addition, in the spectrum measured by ¹H-NMR, a peak derived from an alkoxy group was not observed, and an acid value was measured at approximately 0.007 mg KOH/g.

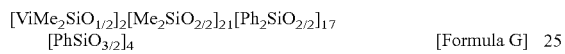

[Formula G]

Synthesis Example 8

A polysiloxane was synthesized by the method described in Synthesis Example 3, except that 183.71 g of tetramethyltetraphenylcyclotetrasiloxane was mixed instead of octamethylcyclotetrasiloxane and octaphenylcyclotetrasiloxane, and the amount at which divinyltetramethyldisiloxane was mixed was changed to 12.10 g. The polysiloxane was represented by Formula H and present in transparent oil. The polysiloxane had a viscosity at 25° C. of 19,800 cP and a molecular weight of approximately 4,800. In addition, from the spectrum measured by ¹H-NMR for the organopolysiloxane, a peak derived from an alkoxy group was not observed, and an acid value was measured at approximately 0.008 mg KOH/g.

$[ViMe_2SiO_{1/2}]_2[MePhSiO_{2/2}]_{32}[PhSiO_{3/2}]_4$  [Formula H]

Synthesis Example 9

30.0 g of octamethylcyclotetrasiloxane, 53.5 g of octaphenylcyclotetrasiloxane, 8.7 g of octaphenyl-POSS and 6.3 g of divinyltetramethyldisiloxane were mixed, and 0.3 mL of TMAH was mixed into the mixture as a catalyst. Afterward, the mixture into which the catalyst was mixed was reacted at 115° C. for approximately 20 hours. A low molecular weight material was removed from the reaction product after the end of the reaction, thereby obtaining a transparent oil-type polysiloxane represented by Formula I. The organopolysiloxane had a viscosity at 25° C. of 21,100 cP and a molecular weight of approximately 6,100. In addition, from the spectrum measured by ¹H-NMR for the organopolysiloxane, a peak derived from an alkoxy group was not observed, and an acid value was measured at approximately 0.01 mg KOH/g.

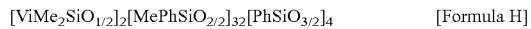

[Formula I]

Synthesis Example 10

A polysiloxane was synthesized by the method described in Synthesis Example 9, except that the amount at which octaphenyl-POSS was mixed was changed to 4.4 g. The polysiloxane was represented by Formula J and present in transparent oil. The polysiloxane had a viscosity at 25° C. of 10,200 cP and a molecular weight of approximately 5,600. In addition, in the spectrum measured by ¹H-NMR, a peak derived from an alkoxy group was not observed, and an acid value was measured at approximately 0.009 mg KOH/g.

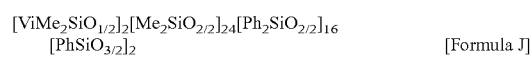

[Formula J]

Synthesis Example 11

A polysiloxane was synthesized by the method described in Synthesis Example 9, except that the amount at which divinyltetramethyldisiloxane was mixed was changed to 9.4 g. The polysiloxane was represented by Formula K and present in transparent oil. The polysiloxane had a viscosity at 25° C. of 12,200 cP and a molecular weight of approximately 4,700. In addition, in the spectrum measured by ¹H-NMR, a peak derived from an alkoxy group was not observed, and an acid value was measured at approximately 0.008 mg KOH/g.

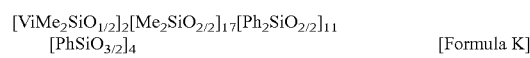

[Formula K]

Synthesis Example 12

A polysiloxane was synthesized by the method described in Synthesis Example 9, except that the amounts at which octamethylcyclotetrasiloxane, octaphenylcyclotetrasiloxane and divinyltetramethyldisiloxane were mixed were changed to 27.2 g, 60.2 g and 7.9 g, respectively. The polysiloxane was represented by Formula L and present in transparent oil. The polysiloxane had a viscosity at 25° C. of 33,200 cP and a molecular weight of approximately 4,600. In addition, in the spectrum measured by ¹H-NMR, a peak derived from an alkoxy group was not observed, and an acid value was measured at approximately 0.007 mg KOH/g.

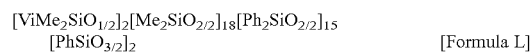

[Formula L]

Synthesis Example 13

A polysiloxane was synthesized by the method described in Synthesis Example 9, except that 12.5 g of a polysiloxane represented as Formula $[ViMe_2SiO_{1/2}][PhSiO_{3/2}]_{3.5}$ and a molecular weight of 1,520 was used instead of octaphenyl-POSS, and the amount at which divinyltetramethyldisiloxane was mixed was changed to 6.1 g. The polysiloxane was represented by Formula M and present in transparent oil. The polysiloxane had a viscosity at 25° C. of 15,500 cP and a molecular weight of approximately 5,300. In addition, in the spectrum measured by ¹H-NMR, a peak derived from an alkoxy group was not observed, and an acid value was measured at approximately 0.012 mg KOH/g.

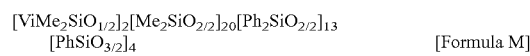

[Formula M]

Synthesis Example 14

61.0 g of water and 7.9 mL of nitric acid were further mixed into a solution prepared by dissolving 89.0 g of dimethoxydimethylsilane, 148.4 g of dimethoxydiphenylsilane, 14.7 g of dimethoxymethylvinylsilane, 15.7 g of divinyltetramethyldisiloxane and 26.7 g of phenyltrimethoxysilane in 330 g of toluene. Subsequently, the mixture was reacted at 100° C. for approximately 7 hours. After the completion of the reaction, the reaction solution was cooled down at room temperature, and washed with water until the reaction solution became neutral. Afterward, 0.1 g of KOH was added to the solution, and thus dehydrating condensation progressed. After the reaction, a reaction solution was neutralized using acetyl hydroxide (AcOH) and washed with water until becoming neutral, and a solvent was removed through distillation under reduced pressure, thereby obtaining an organopolysiloxane. The obtained organopolysiloxane was represented by Formula N and present in transparent oil, and had a large amount of cyclic low molecular weight materials. It was difficult to separate the organopolysiloxane since it had a similar molecular weight to the low molecular weight material. In addition, from the spectrum measured by $^1$H-NMR for the organopolysiloxane, an area of a peak derived from OMe/Vi was approximately 0.2, and thereby the presence of large amounts of methoxy groups in the structure was confirmed. Moreover, an acid value was measured at approximately 0.270. The reaction solution had a viscosity at 25° C. of 2,300 cP, which was a very low value.

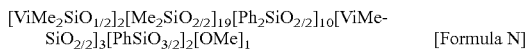  [Formula N]

Synthesis Example 15

An organopolysiloxane was synthesized by the same method as described in Synthesis Example 14, except that 13.4 g of phenyltrimethoxysilane was used instead of octaphenyl-POSS. The synthesized organopolysiloxane was represented by Formula O and had a large amount of cyclic low molecular weight materials. It was difficult to separate the organopolysiloxane since it had a similar molecular weight to the low molecular weight material. In addition, from the spectrum measured by $^1$H-NMR for the organopolysiloxane, an area of a peak derived from OMe/Vi was approximately 0.7, and thereby the presence of large amounts of methoxy groups in the structure was confirmed. Moreover, an acid value was measured at approximately 0.276. The reaction solution had a viscosity at 25° C. of 2,800 cP, which was a very low value.

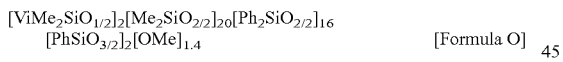  [Formula O]

Example 1

A curable composition capable of being cured by hydrosilylation was prepared by mixing compounds represented by Formulas B-1, C-1 and D-1 with the organopolysiloxane (A) prepared in Synthesis Example 1 by a known method (mixing amounts: organopolysiloxane (A): 100 g, compound of Formula B-1: 100 g, compound of Formula C-1: 50 g and compound of Formula D-1: 4 g). Subsequently, a catalyst (platinum(0)-1,3-divinyl-1,1,3,3-tetramethyldisiloxane) was mixed with the composition to have a content of Pt(0) of 5 ppm, the mixture was uniformly mixed, and bubbles were removed using a defoamer, thereby completing the curable composition.

  [Formula B-1]

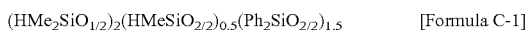  [Formula C-1]

  [Formula D-1]

Example 2

A curable composition capable of being cured by hydrosilylation was prepared by mixing compounds represented by Formulas B-2, C-2, C-3 and D-1 with the organopolysiloxane (B) prepared in Synthesis Example 2 by a known method (mixing amounts: organopolysiloxane (B): 50 g, compound of Formula B-2: 100 g, compound of Formula C-2: 40 g, compound of Formula C-3: 10 g and compound of Formula D-1: 4 g). Subsequently, a catalyst (platinum(0)-1,3-divinyl-1,1,3,3-tetramethyldisiloxane) was mixed with the composition to have a content of Pt(0) of 5 ppm, the mixture was uniformly mixed, and bubbles were removed using a defoamer, thereby completing the curable composition.

  [Formula B-2]

  [Formula C-2]

  [Formula C-3]

  [Formula D-1]

Example 3

A curable composition was prepared by the same method as described in Example 1, except that 40 g of the organopolysiloxane (C) prepared in Synthesis Example 3, 100 g of the compound of Formula B-2, 35 g of the compound of Formula C-4, and 4 g of the compound of Formula D-2 were mixed, and a catalyst was mixed.

  [Formula B-2]

  [Formula C-4]

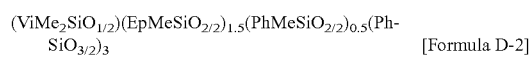  [Formula D-2]

Example 4

A curable composition was prepared by the same method as described in Example 1, except that 40 g of the organopolysiloxane (D) prepared in Synthesis Example 4, 100 g of the compound of Formula B-2, 35 g of the compound of Formula C-4, and 4 g of the compound of Formula D-2 were mixed, and a catalyst was mixed.

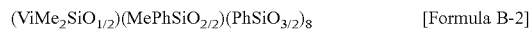  [Formula B-2]

  [Formula C-4]

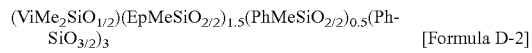  [Formula D-2]

Example 5

A curable composition was prepared by the same method as described in Example 1, except that 40 g of the organopolysiloxane (E) prepared in Synthesis Example 5, 100 g of the compound of Formula B-2, 35 g of the compound of Formula C-4, and 4 g of the compound of Formula D-2 were mixed, and a catalyst was mixed.

   [Formula B-2]

   [Formula C-4]

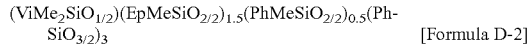   [Formula D-2]

Example 6

A curable composition was prepared by the same method as described in Example 1, except that 40 g of the organopolysiloxane (F) prepared in Synthesis Example 6, 100 g of the compound of Formula B-2, 35 g of the compound of Formula C-4, and 4 g of the compound of Formula D-2 were mixed, and a catalyst was mixed.

   [Formula B-2]

   [Formula C-4]

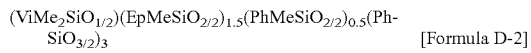   [Formula D-2]

Example 7

A curable composition was prepared by the same method as described in Example 1, except that 40 g of the organopolysiloxane (G) prepared in Synthesis Example 7, 100 g of the compound of Formula B-2, 35 g of the compound of Formula C-4, and 4 g of the compound of Formula D-2 were mixed, and a catalyst was mixed.

   [Formula B-2]

   [Formula C-4]

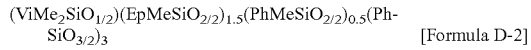   [Formula D-2]

Example 8

A curable composition was prepared by the same method as described in Example 1, except that 40 g of the organopolysiloxane (H) prepared in Synthesis Example 8, 100 g of the compound of Formula B-2, 35 g of the compound of Formula C-4, and 4 g of the compound of Formula D-2 were mixed, and a catalyst was mixed.

   [Formula B-2]

   [Formula C-4]

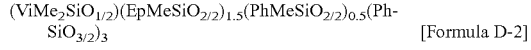   [Formula D-2]

Example 9

A curable composition was prepared by the same method as described in Example 1, except that 40 g of the organopolysiloxane (I) prepared in Synthesis Example 9, 100 g of the compound of Formula B-2, 35 g of the compound of Formula C-4, and 4 g of the compound of Formula D-2 were mixed, and a catalyst was mixed.

   [Formula B-2]

   [Formula C-4]

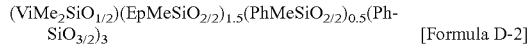   [Formula D-2]

Example 10

A curable composition was prepared by the same method as described in Example 1, except that 40 g of the organopolysiloxane (J) prepared in Synthesis Example 10, 100 g of the compound of Formula B-2, 35 g of the compound of Formula C-4, and 4 g of the compound of Formula D-2 were mixed, and a catalyst was mixed.

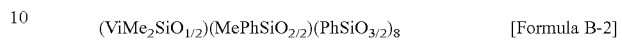   [Formula B-2]

   [Formula C-4]

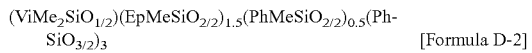   [Formula D-2]

Example 11

A curable composition was prepared by the same method as described in Example 1, except that 40 g of the organopolysiloxane (K) prepared in Synthesis Example 11, 100 g of the compound of Formula B-2, 35 g of the compound of Formula C-4, and 4 g of the compound of Formula D-2 were mixed, and a catalyst was mixed.

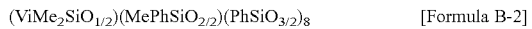   [Formula B-2]

   [Formula C-4]

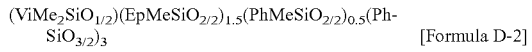   [Formula D-2]

Example 12

A curable composition was prepared by the same method as described in Example 1, except that 40 g of the organopolysiloxane (L) prepared in Synthesis Example 12, 100 g of the compound of Formula B-2, 35 g of the compound of Formula C-4, and 4 g of the compound of Formula D-2 were mixed, and a catalyst was mixed.

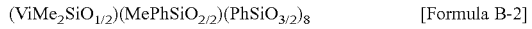   [Formula B-2]

   [Formula C-4]

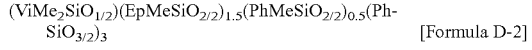   [Formula D-2]

Example 13

A curable composition was prepared by the same method as described in Example 1, except that 40 g of the organopolysiloxane (M) prepared in Synthesis Example 13, 100 g of the compound of Formula B-2, 35 g of the compound of Formula C-4, and 4 g of the compound of Formula D-2 were mixed, and a catalyst was mixed.

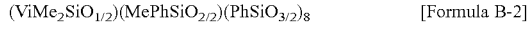   [Formula B-2]

   [Formula C-4]

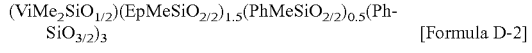   [Formula D-2]

Comparative Example 1

A curable composition was prepared by the same method as described in Example 1, except that the organopolysiloxane (N) prepared in Synthesis Example 14 was used instead of the organopolysiloxane (A).

Comparative Example 2

A curable composition was prepared by the same method as described in Example 2, except that the organopolysiloxane (O) prepared in Synthesis Example 15 was used instead of the organopolysiloxane (B).

Comparative Example 6

A curable composition was prepared by the same method as described in Example 3, except that the organopolysiloxane (C) was not used.

Physical properties measured with respect to respective curable compositions are shown in Table 1.

TABLE 1

| | Surface Stickiness | Thermal & Shock Resistance | Reliability |
|---|---|---|---|
| Example 1 | ○ | 0/10 | ○ |
| Example 2 | ○ | 0/10 | ○ |
| Example 3 | ○ | 0/10 | ○ |
| Example 4 | ○ | 0/10 | ○ |
| Example 5 | ○ | 0/10 | ○ |
| Example 6 | ○ | 0/10 | ○ |
| Example 7 | ○ | 0/10 | ○ |
| Example 8 | ○ | 0/10 | ○ |
| Example 9 | ○ | 0/10 | ○ |
| Example 10 | ○ | 0/10 | ○ |
| Example 11 | ○ | 0/10 | ○ |
| Example 12 | ○ | 0/10 | ○ |
| Example 13 | ○ | 0/10 | ○ |
| Comparative Example 1 | ○ | 6/10 | X |
| Comparative Example 2 | ○ | 7/10 | X |
| Comparative Example 3 | ○ | 9/10 | X |

An illustrative curable composition exhibits excellent processibility and workability. In addition, the curable composition exhibits excellent light extraction efficiency, crack resistance, hardness, thermal and shock resistance and an adhesive property after curing. In addition, the composition may provide an encapsulant exhibiting stable durability and reliability under severe conditions for a long time and having no whitening and surface stickiness.

What is claimed is:

1. A curable composition, comprising:
   (A) an organopolysiloxane having an average composition formula of Formula 1, which has an acid value obtained by KOH titration of 0.05 mgKOH/g or less, which has a ratio (OR/Ak) of an area (OR) of a peak derived from an alkoxy group binding to a silicon atom to an area (Ak) derived from an alkenyl group binding to a silicon atom in a $^1$H-NMR spectrum of 0.05 or less, and which is a reaction product of a mixture including a compound of Formula 5 and an organopolysiloxane represented as an average composition formula of Formula 6 or 7; and
   (B) an organopolysiloxane comprising an alkenyl group, an epoxy group and an aryl group:

$$(R^1R^2{}_2SiO_{1/2})_a(R^3R^4SiO_{2/2})_b(R^5SiO_{3/2})_c(SiO_2)_d \quad \text{[Formula 1]}$$

where $R^1$ is a monovalent hydrocarbon group having at least two carbon atoms, $R^2$ is an alkyl group having 1 to 4 carbon atoms, $R^3$ and $R^4$ are each independently an alkyl group having 1 to 20 carbon atoms, an alkenyl group having 2 to 20 carbon atoms or an aryl group having 6 to 25 carbon atoms, $R^5$ is an alkyl group having 1 to 20 carbon atoms or an aryl group having 6 to 25 carbon atoms, with the proviso that at least one of $R^1$, $R^3$ and $R^4$ is an alkenyl group; a is a positive number, b is a positive number, c is a positive number, d is 0 or a positive number, b/a is 5 or more, and b/c is 5 or more,

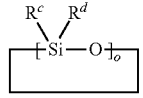

[Formula 5]

$$[R^eSiO_{3/2}] \quad \text{[Formula 6]}$$

$$[R^aR^b{}_2SiO_{1/2}]_p[R^eSiO_{3/2}]_q \quad \text{[Formula 7]}$$

where $R^a$ is a monovalent hydrocarbon group having at least two carbon atoms, $R^b$ is an alkyl group having 1 to 4 carbon atoms, $R^c$ to $R^e$ are each independently an aryl group having 6 to 25 carbon atoms, an alkyl group having 1 to 20 carbon atoms or a monovalent hydrocarbon group having at least two carbon atoms, o is 3 to 6, p is 1 to 3, and q is 1 to 10.

2. The curable composition according to claim 1, wherein a molar ratio (Ak/Si) of alkenyl groups in the organopolysiloxane (A) with respect to silicon atoms in the organopolysiloxane (A) is 0.02 to 0.2.

3. The curable composition according to claim 1, wherein a molar ratio (Ar/Si) of aryl groups in the organopolysiloxane (A) with respect to silicon atoms in the organopolysiloxane (A) is 0.3 or more.

4. The curable composition according to claim 1, wherein b/(a+b+c+d) of Formula 1 is 0.5 or more.

5. The curable composition according to claim 1, wherein b/(b+c) of Formula 1 is 0.5 or more.

6. The curable composition according to claim 1, wherein the organopolysiloxane (A) has an average composition formula of Formula 2:

$$(R^1R^2{}_2SiO_{1/2})_a(R^6R^7SiO_{2/2})_l(R^8R^9SiO_{2/2})_m(R^5SiO_{3/2})_c \quad \text{[Formula 2]}$$

where $R^1$, $R^2$ and $R^5$ are the same as defined in Formula 1, $R^6$ is an aryl group having 6 to 25 carbon atoms, $R^7$, $R^8$ and $R^9$ are each independently an alkyl group having 1 to 20 carbon atoms, an alkenyl group having 2 to 20 carbon atoms or an aryl group having 6 to 25 carbon atoms, with the proviso that at least one of $R^1$, $R^7$, $R^8$ and $R^9$ is an alkenyl group; and, when a+l+m+c is converted into 1, a is 0.01 to 0.10, l is 0 to 0.90, m is 0 to 0.90, and c is 0.01 to 0.30, (l+m)/a is 5 or more, and (l+m)/c is 5 or more.

7. The curable composition according to claim 1, wherein the organopolysiloxane (B) has an average composition formula of Formula 9:

$$(R_3SiO_{1/2})_q(R_2SiO_{2/2})_r(RSiO_{3/2})_s(SiO_{4/2})_t \quad \text{[Formula 9]}$$

where R's are each independently an epoxy group or a monovalent hydrocarbon group, with the proviso that at least one of R's is an alkenyl group, at least one of R's is an epoxy group and at least one of R's is an aryl group, and q, r, s and t are each 0 or a positive number, with the proviso that $(s+t)/(q+r+s+t)$ is 0.2 to 0.7, and $s/(s+t)$ is 0.8 or more.

8. The curable composition according to claim 1, wherein a molar ratio (Ak/Si) of alkenyl groups in the organopolysiloxane (B) with respect to silicon atoms in the organopolysiloxane (B) is 0.05 to 0.35.

9. The curable composition according to claim 1, wherein a molar ratio (Ep/Si) of epoxy groups (Ep) in the organocpolysiloxane (B) with respect to silicon atoms included in the organopolysiloxane of (B) is 0.05 or more.

10. The curable composition according to claim 1, wherein a molar ratio (Ar/Si) of aryl groups in the organopolysiloxane (B) with respect to silicon atoms in the organopolysiloxane of (B) is 0.2 to 1.0.

11. The curable composition according to claim 1, further comprising an organopolysiloxane having an average composition formula of Formula 10:

$$(R^{14}_3SiO_{1/2})_d(R^{14}_2SiO_{2/2})_e(R^{14}SiO_{3/2})_f(SiO_{4/2})_g \quad \text{[Formula 10]}$$

where $R^{14}$'s are each independently a monovalent hydrocarbon group or an epoxy group, with the proviso that at least one of $R^{14}$'s is an alkenyl group and at least one of $R^{14}$'s is an aryl group; and, when d+e+f+g is converted into 1, d is 0.05 to 0.5, e is 0 to 0.3, f is 0.6 to 0.95, g is 0 to 0.2, f and g are not simultaneously 0, $(d+e)/(d+e+f+g)$ is 0.2 to 0.7, $e/(e+f+g)$ is 0.3 or less, and $f/(f+g)$ is 0.8 or more.

12. The curable composition according to claim 1, further comprising a compound of Formula 11 or a compound having an average composition formula of Formula 12:

$$R^{15}_3SiO(R^{15}_2SiO)_nSiR^{15}_3 \quad \text{[Formula 11]}$$

where $R^{15}$'s are each independently hydrogen atom or a monovalent hydrocarbon group, with the proviso that one or at least two of $R^{15}$'s is the hydrogen atom and at least one of $R^{15}$'s is an aryl group; and n is 1 to 100:

$$(R^{16}_3SiO_{1/2})_h(R^{16}_2SiO_{2/2})_i(R^{16}SiO_{3/2})_j(SiO_2)_k \quad \text{[Formula 12]}$$

where $R^{16}$'s are each independently a hydrogen atom or a monovalent hydrocarbon group, with the proviso that one or at least two of $R^{16}$'s is the hydrogen atoms and at least one of $R^{16}$'s is an aryl group; and, when h+i+j+k is converted into 1, h is 0.1 to 0.8, i is 0 to 0.5, j is 0.1 to 0.8, and k is 0 to 0.2, with the proviso that i and k are not simultaneously 0.

13. A light emitting diode encapsulated with a cured product of the curable composition of claim 1.

14. A liquid crystal display comprising the light emitting diode of claim 13.

15. A lighting apparatus comprising the light emitting diode of claim 13.

* * * * *